(12) United States Patent
Jung et al.

(10) Patent No.: US 9,257,624 B2
(45) Date of Patent: *Feb. 9, 2016

(54) LIGHT EMITTING DIODE PACKAGE

(71) Applicant: Seoul Semiconductor Co., Ltd., Ansan-si (KR)

(72) Inventors: Jung Hwa Jung, Ansan-si (KR); Hee Tak Oh, Ansan-si (KR); Do Hyung Kim, Ansan-si (KR); You Jin Kwon, Ansan-si (KR); Oh Sug Kim, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/678,598

(22) Filed: Apr. 3, 2015

(65) Prior Publication Data

US 2015/0214453 A1 Jul. 30, 2015

Related U.S. Application Data

(63) Continuation of application No. 14/320,380, filed on Jun. 30, 2014, now Pat. No. 9,048,391, which is a continuation of application No. 13/320,356, filed as application No. PCT/KR2010/004222 on Jun. 30, 2010, now Pat. No. 8,796,706.

(30) Foreign Application Priority Data

Jul. 3, 2009 (KR) .................. 10-2009-0060429
Jan. 6, 2010 (KR) .................. 10-2010-0000724

(51) Int. Cl.
*H01L 33/00* (2010.01)
*H01L 21/00* (2006.01)
(Continued)

(52) U.S. Cl.
CPC ............ *H01L 33/62* (2013.01); *H01L 25/0753* (2013.01); *H01L 33/382* (2013.01);
(Continued)

(58) Field of Classification Search
CPC ............................................... H01L 33/48
USPC ......... 257/78–103, 13, 918, E33.072, E33.54; 438/22–29
See application file for complete search history.

(56) References Cited

U.S. PATENT DOCUMENTS 7,361,940 B2 4/2008 Kim et al.
7,723,736 B2 5/2010 Lee et al.
(Continued)

FOREIGN PATENT DOCUMENTS

EP 1670075 6/2006
JP H07-335823 12/1995
(Continued)

OTHER PUBLICATIONS

International Search Report issued on Feb. 7, 2011 for International Application No. PCT/KR2010/004222.
(Continued)

*Primary Examiner* — Calvin Lee
(74) *Attorney, Agent, or Firm* — H.C. Park & Associates, PLC

(57) ABSTRACT

A light emitting diode package includes a package body having a cavity, a light emitting diode chip having a plurality of light emitting cells connected in series to one another, a phosphor converting a frequency of light emitted from the light emitting diode chip, and a pair of lead electrodes. The light emitting cells are connected in series between the pair of lead electrodes.

13 Claims, 10 Drawing Sheets

(51) Int. Cl.
*H01L 33/62* (2010.01)
*H01L 25/075* (2006.01)
*H01L 33/64* (2010.01)
*H01L 33/58* (2010.01)
*H01L 33/38* (2010.01)
*H01L 33/52* (2010.01)
H01L 25/16 (2006.01)
H01L 33/48 (2010.01)

(52) U.S. Cl.
CPC ............... *H01L 33/48* (2013.01); *H01L 33/52* (2013.01); *H01L 33/58* (2013.01); *H01L 33/64* (2013.01); *H01L 33/642* (2013.01); *H01L 25/167* (2013.01); *H01L 33/486* (2013.01); *H01L 2224/48227* (2013.01)

(56) References Cited

U.S. PATENT DOCUMENTS

| | | | |
|---|---|---|---|
| 7,808,013 | B2 | 10/2010 | Mendendorp et al. |
| 8,796,706 | B2 * | 8/2014 | Jung et al. ............... 257/97 |
| 9,048,391 | B2 * | 6/2015 | Jung et al. ............... 257/97 |
| 2008/0087902 | A1 | 4/2008 | Lee et al. |
| 2008/0164485 | A1 | 7/2008 | Lee |
| 2008/0296592 | A1 | 12/2008 | Osamu |
| 2009/0050907 | A1 | 2/2009 | Yuan et al. |
| 2009/0114937 | A1 | 5/2009 | Kawakubo |

FOREIGN PATENT DOCUMENTS

| | | |
|---|---|---|
| JP | 2002-026263 | 1/2002 |
| JP | 2007-048969 | 2/2007 |
| JP | 2007-095722 | 4/2007 |
| JP | 2007-149810 | 6/2007 |
| JP | 2007-235003 | 9/2007 |
| JP | 2008-041811 | 2/2008 |
| JP | 2008-172152 | 7/2008 |
| JP | 2008-186914 | 8/2008 |
| KR | 10-2005-0014769 | 2/2005 |
| KR | 10-2006-0086534 | 8/2006 |
| KR | 10-2006-0087620 | 8/2006 |
| KR | 10-2006-0090014 | 8/2006 |
| KR | 10-2006-0090015 | 8/2006 |
| KR | 10-0647867 | 11/2006 |
| KR | 10-0649765 | 11/2006 |
| KR | 10-2007-0036900 | 4/2007 |
| KR | 10-2007-0087270 | 8/2007 |
| KR | 10-2007-0107734 | 11/2007 |
| KR | 10-0826411 | 4/2008 |
| KR | 10-0855356 | 8/2008 |
| KR | 10-2009-0046701 | 5/2009 |
| TW | 200418150 | 9/2004 |
| TW | 200735414 | 9/2007 |
| TW | 200903762 | 1/2009 |
| TW | 200915626 | 4/2009 |

OTHER PUBLICATIONS

Taiwanese Office Action issued on Mar. 27, 2013 in TW Patent Application No. 099121844.
Non-Final Office Action dated Sep. 13, 2013 in U.S. Appl. No. 13/320,356.
Final Office Action dated Jan. 13, 2014 in U.S. Appl. No. 13/320,356.
Notice of Allowance dated Mar. 20, 2014 in U.S. Appl. No. 13/320,356.
Corrected Notice of Allowance dated May 22, 2014 in U.S. Appl. No. 13/320,356.
Non-Final Office Action dated Sep. 11, 2014 in U. S. Appl. No. 14/320,380.
Notice of Allowance dated Feb. 4, 2015 in U. S. Appl. No. 14/320,380.

* cited by examiner

LIGHT EMITTING DIODE PACKAGE

CROSS-REFERENCE TO RELATED APPLICATIONS

This application is a continuation of U.S. patent application Ser. No. 14/320,380, filed on Jun. 30, 2014, and issued as U.S. Pat. No. 9,048,391 on Jun. 2, 2015, which is a continuation of U.S. patent application Ser. No. 13/320,356, filed on Nov. 14, 2011, and issued as U.S. Pat. No. 8,796,706 on Aug. 5, 2014, which is the National Stage Entry of International Application No. PCT/KR2010/004222, filed on Jun. 30, 2010, and claims priority from and the benefit of Korean Patent Application No. 10-2009-0060429, filed on Jul. 3, 2009, and Korean Patent Application No. 10-2010-0000724, filed on Jan. 6, 2010, all of which are incorporated herein by reference for all purposes as if fully set forth herein.

BACKGROUND OF THE INVENTION

1. Field of the Invention

The present invention relates to a light emitting diode package and, more particularly, to a high voltage light emitting diode package that may be operated under a high voltage.

2. Discussion of the Background

Light emitting devices equipped with light emitting diodes, for instance, light emitting diode packages, are widely used not only for applications such as pilot lamps, electronic scoreboards and displays due to its capability of realizing various colors, but also for regular lighting due to capability of realizing white light. Light emitting diodes are increasingly used in various fields due to advantageous features, such as high efficiency, long operational lifespan, and environmental friendliness.

A white light emitting device is generally composed of a combination of a blue light emitting diode and a yellow phosphor. However, since the white light emitting device composed of the combination of the blue light emitting diode and the yellow phosphor emits white light having high color temperature due to lack of a red color region, it is not suitable for regular lighting.

While a red phosphor may be also used to realize a warm white color having low color temperature, application of the red phosphor is limited due to low optical efficiency of the red phosphor. Further, phosphors react with moisture absorbed from the outside and experience efficiency deterioration over time, thereby reducing operational lifespan of the light emitting device and, in particular, the red phosphor experiences more rapid efficiency deterioration than a green or yellow phosphor, thereby further reducing operational lifespan of the light emitting device.

On the other hand, in order to apply the light emitting device to regular lighting using a household power source or the like, it is necessary to provide a light emitting diode package that can be operated under a high voltage. Since a regular light emitting diode chip has an operating voltage in the range of 2-4V, it is difficult to operate a single light emitting diode chip under a high voltage. Thus, several light emitting diode chips are connected in series for operation at high voltage. However, using multiple light emitting diode chips results in an increase of the number of wire-bonding processes and an increase of a package size. Further, when the light emitting device is operated under the high voltage, it is necessary for the light emitting device to have a heat dissipation means for handling a large amount of heat generated therefrom and to prevent current leakage caused by application of such high voltage. In particular, when a red light emitting diode chip is used instead of the red phosphor along with a blue light emitting diode chip, a red light emitting diode chip using a compound semiconductor substrate such as GaAs or InP is likely to undergo current leakage through the substrate. The current leakage deteriorates electrical stability, thereby restricting the utility of light emitting diodes.

SUMMARY OF THE INVENTION

An objective of the present invention is to provide a high voltage light emitting diode package which may have a minimized size.

Another objective of the present invention is to provide a light emitting diode package capable of realizing white light, particularly, warm white light.

Another objective of the present invention to provide a light emitting diode package capable of providing electrical stability by preventing current leakage that can occur from light emitting diode chips.

Another objective of the present invention is to provide a light emitting diode package capable of preventing moisture infiltration.

Another objective of the present invention is to provide a light emitting diode package that experiences low light loss and high heat dissipation efficiency while reducing restriction in mounting and/or wire-bonding of light emitting diodes.

In accordance with an aspect, the present invention provides a light emitting diode package comprising: a package body having a cavity; a light emitting diode chip having a plurality of light emitting cells connected in series to one another; and a pair of lead electrodes. The light emitting cells are connected in series between the pair of lead electrodes. It is possible to provide a high voltage light emitting diode package capable of relieving an increase in package size by mounting the light emitting diode chip having the light emitting diode cells thereon.

A landing pad may be positioned on a bottom surface of the cavity and the light emitting diode chip may be mounted on the landing pad. Further, bonding pads may be separated from the landing pad on the bottom surface of the cavity and have wires bonded to the bonding pads. Two of the bonding pads may be connected to the pair of lead electrodes, respectively.

Further, the light emitting diode package may further include Zener diodes. The Zener diodes are connected in parallel to the light emitting diode chip. The Zener diodes may be mounted on the two bonding pads, respectively. The Zener diodes may be connected with opposite polarities in parallel to the light emitting diode chip. Thus, it is possible to prevent electrostatic discharge in a forward or reverse direction.

The landing pad may be formed of a metallic material having high reflectivity. Thus, it is possible to reflect light emitted from the light emitting diode chip using the landing pad, thereby providing a high efficiency light emitting diode package.

The light emitting diode package may further include at least one light emitting diode chip that emits light having a different frequency from the light emitted from the light emitting diode chip having the plurality of light emitting cells. It is possible to realize various colors, for example, white light, by a combination of these light emitting diode chips and the phosphor.

A molding portion may cover the light emitting diode chip having the plurality of light emitting cells and the at least one light emitting diode chip, and the phosphor may be distributed in the molding portion.

The light emitting diode package may include a plurality of landing pads separated from each other on the bottom surface of the cavity, and the light emitting diode chip having the plurality of light emitting cells and the at least one light emitting diode chip may be mounted on the landing pads, respectively. These light emitting diode chips may be connected in series to each other between the pair of lead electrodes.

The light emitting diode chip having the plurality of light emitting cells may emit blue light, and the at least one light emitting diode chip may emit red light.

As such, it is possible to operate a light emitting diode package at high voltage by serially connecting a blue light emitting diode chip, which has a plurality of light emitting cells serially connected to one another, to a plurality of red light emitting diode chips in the light emitting diode package. Further, it is possible to prevent current leakage from the light emitting diode chips from occurring by mounting the light emitting diode chips on the respective landing pads separated from each other. Furthermore, it is possible to realize warm white light under a high voltage via a combination of a blue light emitting diode chip, a plurality of red light emitting diode chips, and a phosphor.

The phosphor is disposed above the blue light emitting diode chip and the red light emitting diode chips to change the frequency of light emitted from the blue light emitting diode chip while scattering the light emitted from blue light emitting diode chip and light emitted from the red light emitting diode chip to uniformly mix the light.

In some embodiments, the cavity may include a first cavity and a second cavity with a step formed therebetween. Here, the first cavity is located below the second cavity and the landing pads are positioned on a bottom surface of the first cavity.

The high voltage light emitting diode package may further include a molding portion covering the light emitting diode chips in the first cavity, a lens bonding agent formed on a bottom surface of the second cavity and the molding portion, and a lens bonded to the package body by the lens bonding agent. The lens enables adjustment of direction of light.

The phosphor may be distributed in the molding portion. The molding portion may be a gel-type silicone and the lens bonding agent may be a high hardness silicone having a Durometer Shore hardness of 60 or more. It is possible to enhance interface characteristics between the molding portion and the lens bonding agent and between the lens bonding agent and the lens and, in particular, to prevent interface delamination and moisture infiltration by a combination of the gel-type silicone molding portion and the high hardness silicone bonding agent. Preferably, the lens is a glass lens to prevent the moisture infiltration.

In one embodiment, the package body may include a package lower part having a stack structure of substrates and a package upper part stacked on the package lower part and having the cavity formed therein. Here, the lead electrodes may be electrically connected to conductive patterns formed between the package upper part and the package lower part and may extend to a lower surface of the package body through a side surface of the package body. Further, the package body may have grooves formed on a side periphery of the package body, and the lead electrodes may extend to the lower surface of the package body along the grooves, respectively. Here, the grooves may be formed on side corners of the package body. The package lower part may include ceramic substrates stacked in two or more layers, and the lead electrodes may fixedly surround the ceramic substrate stacked in two or more layers. The lead electrodes may be separated from each other and formed to have a wide area on the lower surface of the package lower part and a metallic heat-dissipating portion may be formed between the lead electrodes on the lower surface thereof.

In one embodiment, the package body may include a lower dielectric substrate and an upper dielectric substrate stacked on the lower dielectric substrate. Here, upper conductive patterns may be formed on an upper surface of the upper dielectric substrate, middle conductive patterns may be formed between the upper and lower dielectric substrates to be connected to the upper conductive patterns through upper vias, and lower conductive patterns may be formed on a lower surface of the lower dielectric substrate to be connected to the middle conductive patterns through lower vias. Heat sink patterns for heat dissipation may be formed between the upper and lower dielectric substrates and on the lower surface of the lower dielectric substrate, and may be connected to each other through a heat transfer via penetrating the lower dielectric substrate.

In accordance with another aspect, the present invention provides a light emitting diode package including a package body and a light emitting diode chip mounted on the package body. The package body of the light emitting diode package includes an upper dielectric substrate having a plurality of upper conductive patterns formed on an upper surface of the upper dielectric substrate, a lower dielectric substrate having a plurality of lower conductive patterns formed on a lower surface of the lower dielectric substrate, a plurality of middle conductive patterns interposed between the upper and lower dielectric substrates, upper vias formed in the upper dielectric substrate to connect the upper conductive patterns to the middle conductive patterns therethrough, respectively, and lower vias formed in the lower dielectric substrate to connect the middle conductive patterns to the lower conductive patterns therethrough, respectively.

In one embodiment, the light emitting diode package may further include a transparent encapsulating portion formed over the upper surface of the upper dielectric substrate to cover the light emitting diode chip and the upper conductive patterns. The transparent encapsulating portion may include a lens having a center coincident with that of the light emitting diode chip. At least one of the middle conductive patterns may extend to a side surface of the upper dielectric substrate or the lower dielectric substrate to be exposed to the outside. In one embodiment, a side surface of the upper dielectric substrate and a side surface of the lower dielectric substrate reside on the same cut plane, at least one of the middle conductive patterns extends to the same cut plane to be exposed to the outside, and all of the upper conductive patterns and all of the lower conductive patterns are formed in limited areas so as not to reach the same cut plane. At least one of the upper vias and at least one of the lower vias may be connected to at least one of the middle conductive patterns while alternating with each other. The upper dielectric substrate may have two upper conductive patterns formed on the upper surface thereof. A first heat sink pattern may be formed between the upper dielectric substrate and the lower dielectric substrate, a second heat sink pattern may be formed on the lower surface of the lower dielectric substrate, and a heat transfer via may be formed in the lower dielectric substrate to connect the first heat sink pattern to the second heat sink pattern. The upper conductive patterns may include a first upper conductive pattern at a center of the upper dielectric substrate and second and third upper conductive patterns at opposite sides of the upper dielectric substrate. An alignment mark of the light emitting diode chip may be provided to at least one of the upper conductive patterns and may be formed by regionally exposing the upper surface of the upper dielectric substrate within the upper conductive pattern. The upper dielectric substrate may be formed thereon with a discrimination mark for discriminating a position of the lens. The plurality of upper conductive patterns, plurality of middle conductive patterns and plurality of lower conductive patterns may be formed by regional metal plating.

In accordance with a further aspect, the present invention provides a light emitting diode package including a package body and a light emitting diode chip mounted on the package body. The package body may include a plurality of upper conductive patterns formed on an upper surface of an dielectric substrate by metal plating and electrically connected to the light emitting diode chip by die attaching or wire bonding, a plurality of lower conductive patterns formed on a lower surface of the dielectric substrate by metal plating, conductive materials extending from the respective upper conductive patterns to the respective lower conductive patterns through an interior of the dielectric substrate, and a heat sink pattern formed on the lower surface of the dielectric substrate by metal plating and electrically separated from the upper conductive patterns. The dielectric substrate may include a single ceramic substrate having the upper conductive patterns on an upper surface thereof and the lower conductive patterns on a lower surface thereof. In one embodiment, the dielectric substrate may include a stack structure of upper and lower ceramic substrates, in which the upper ceramic substrate has the upper conductive patterns on an upper surface thereof and the lower ceramic substrate has the lower conductive patterns on a lower surface thereof.

In accordance with yet another aspect, the present invention provides a light emitting diode package including: a package body comprising a first ceramic substrate having conductive patterns including a landing pad formed thereon and at least one second ceramic substrate disposed below the first ceramic substrate; a light emitting diode chip mounted on the landing pad; and lead electrodes connected to at least some of the conductive patterns while extending to a lower surface of the package body through a side surface of the package body. In one embodiment, the light emitting diode chip may include a plurality of light emitting cells connected in series to one another. Each of the lead electrodes may extend to the lower surface of the package body along each side corner of the package body. Further, the side corners of the package body may be formed with grooves receiving the lead electrodes, respectively.

According to one embodiment, the light emitting diode package may operate at high voltage and prevent an increase of a package size by adopting a light emitting diode chip having a plurality of light emitting cells connected in series. Further, it is possible to realize various colors by a combination of the light emitting diode chip having the light emitting cells connected in series and another light emitting diode chip emitting light having a different frequency from the light emitting diode chip. Further, these light emitting diode chips are mounted on landing pads separated from each other, thereby preventing current leakage from the light emitting diode chips. The landing pads dissipate heat from the light emitting diode chips, thereby enhancing heat dissipation of the light emitting diode package. In addition, it is possible to realize high output of white light, in particular, warm white light, under a high voltage by a combination of a blue light emitting diode chip, a plurality of red light emitting diode chips and a phosphor. Further, it is possible to prevent moisture infiltration from outside by a combination of a gel-type silicone molding portion, a high hardness silicone bonding agent, and a glass lens.

In another embodiment, the package body comprises a package lower part and a package upper part, and a middle layer comprising conductive patterns such as a landing pad(s) and a bonding pad(s) is interposed between the package upper part and the package lower part, in which at least some of the conducive patterns extend to a lower side of the package body along a side surface of the package body to be exposed to the outside, so that the light emitting diode package has improved heat dissipation. Furthermore, the conductive patterns fixedly surround the package lower part, in particular, two or more layers of dielectric substrates (or ceramic substrates), thereby enabling the package lower part to be more steadily fixed.

In one embodiment, a light emitting diode chip is directly mounted on an upper surface of a package body having a heat sink structure, on which a light emitting diode chip(s) and/or a Zener diode(s) are disposed by wire bonding, thereby lowering spatial restriction caused by mounting and/or wire bonding the light emitting diode chip(s) and/or the Zener diode(s). Further, since the package body of a substrate shape includes upper and lower dielectric substrates, heat dissipation paths are additionally formed in different directions between the upper and lower dielectric substrates, thereby improving heat dissipation efficiency. Further, it is possible to increase the heat dissipation paths or enlarge the area of the heat dissipation paths via middle conductive patterns. The middle conductive patterns may prevent concentration of heat on a via or the dielectric substrate near the via. An upper via and a lower via are connected to each other through a single middle conductive pattern while alternating with each other, thereby enabling an increase in the number of heat dissipation paths or enlargement of the area of the heat dissipation paths through the middle conductive patterns. The middle conductive patterns may extend to the side surface of the upper or lower dielectric substrate to be exposed to the outside, thereby improving convective heat dissipation effect. Here, the package body of the heat dissipation substrate structure may be produced by dividing a large single substrate into several substrates by dicing. In this case, upper and lower conductive patterns are formed in limited areas so as not to reach a cut plane formed by dicing, so that it is possible to prevent the conductive patterns from being damaged or detached from the package body.

BRIEF DESCRIPTION OF THE DRAWINGS

The above and other aspects, features and advantages of the invention will be more clearly understood from the detailed description taken in conjunction with the accompanying drawings, in which.

DETAILED DESCRIPTION OF THE ILLUSTRATED EMBODIMENTS

Figure 1:
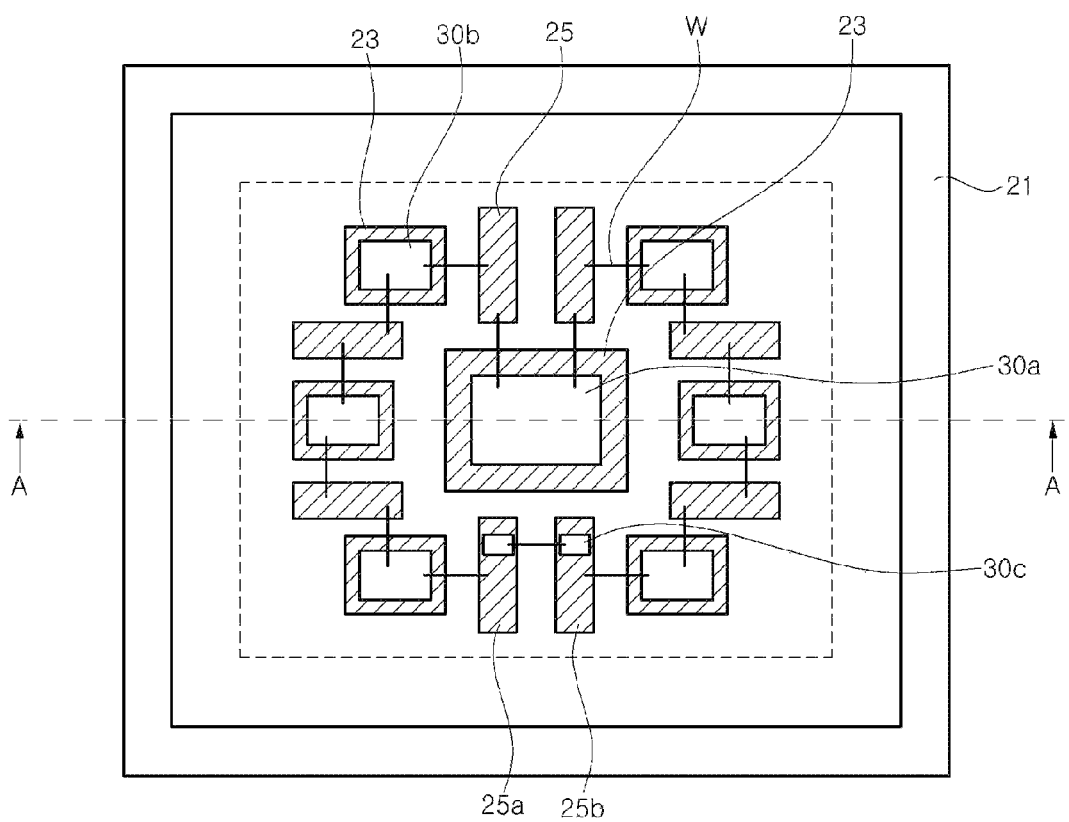
FIG. 1 is a plan view of a high voltage light emitting diode package in accordance with a first embodiment of the present invention.

Hereinafter, exemplary embodiments of the present invention will be described in detail with reference to the accompanying drawings. The following embodiments are given by way of illustration to provide a thorough understanding of the present invention to those skilled in the art. Hence, it should be understood that other embodiments will be evident based on the present invention, and that system, process or mechanical changes may be made without departing from the scope of the present invention. Likewise, it should be noted that the drawings are not to precise scale and some of the dimensions, such as width, length, thickness, and the like, are exaggerated for clarity of description in the drawings. Like elements are denoted by like reference numerals throughout the specification and drawings.

Figure 2:
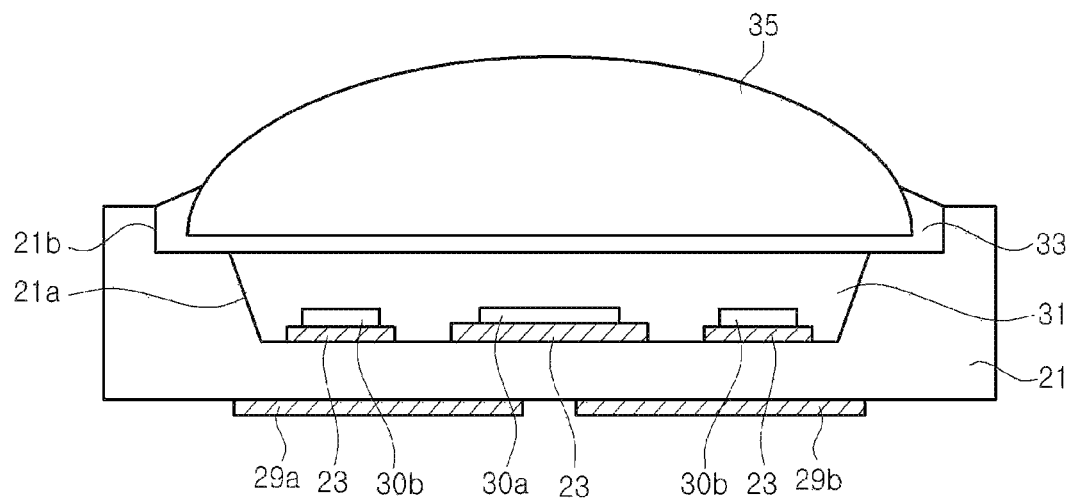
FIG. 2 is a cross-sectional view taken along line A-A of FIG. 1.
Figure 3:
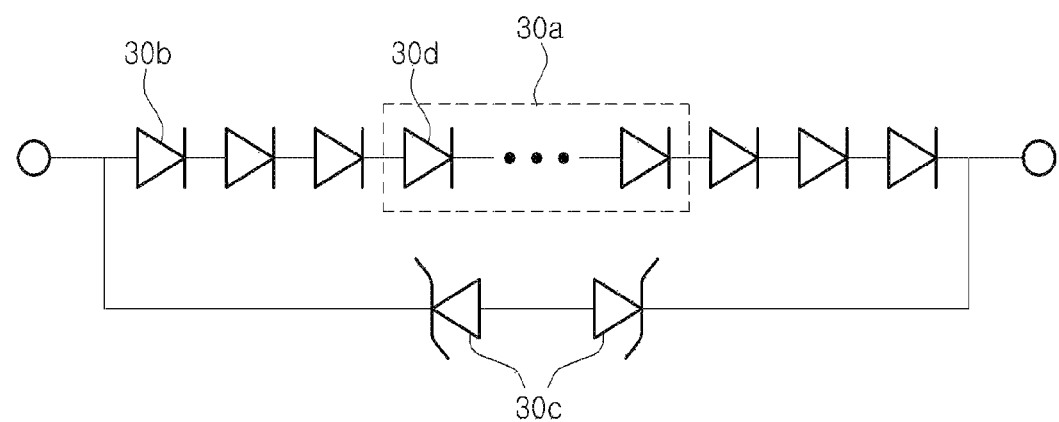
FIG. 3 is an equivalent circuit diagram of the light emitting diode package of FIG. 1.

FIG. 1 is a plan view of a high voltage light emitting diode package in accordance with a first embodiment of the present invention, FIG. 2 is a cross-sectional view taken along line A-A of FIG. 1, and FIG. 3 is an equivalent circuit diagram of the light emitting diode package of FIG. 1.

Referring to FIGS. 1 and 2, the light emitting diode package includes a package body 21, a plurality of landing pads 23, a blue light emitting diode chip 30a, a plurality of red light emitting diode chips 30b, a phosphor, and a pair of lead electrodes 29a, 29b. The light emitting diode package may further include bonding pads 25, 25a, 25b, wires, a molding portion 31, a bonding agent 33, and a lens 35.

The package body 21 may be formed of ceramics or plastics. Preferably, the package body 21 may be formed of ceramics to ensure thermal resistance and electrical stability. The package body 21 may include a first cavity 21a and a second cavity 21b with a step formed therebetween.

The landing pads 23 are positioned on a bottom surface of the first cavity 21a in the package body 21. As shown in the drawings, a landing pad is positioned at the center of the first cavity 21a and other landing pads are positioned around the landing pad. The landing pads are separated from one another on the bottom surface of the first cavity 21a. The landing pads 23 may be formed of a metallic material such as Ag, Al or Cu, which has high reflectivity.

The bonding pads 25 may be disposed on the bottom surface of the first cavity 21. The bonding pads 25 are separated from the landing pads 23 and located between the landing pads 23. The bonding pads 25 may be formed of the same material as that of the landing pads 23, but are not limited thereto. The bonding pads 25 may be formed of a different conductive material than the landing pads 23. At least two bonding pads 25a, 25b of the bonding pads 25 are electrically connected to the lead electrodes 29a, 29b exposed to an outside of the package body 21.

The lead electrodes 29a, 29b are positioned on the bottom surface of the package body 21 to receive power from an external power source. Further, the lead electrodes 29a, 29b may be connected to a bridge rectifier.

The blue light emitting diode chip 30a includes a plurality of light emitting cells 30d connected in series to one another on a single substrate. The blue light emitting diode chip 30a may have, for example, 12 light emitting cells. Pads for wire bonding are provided to opposite sides of the light emitting cells serially connected to one another. In the blue light emitting diode chip 30a, the light emitting cells are formed of an AlInGaN-based compound semiconductor and are connected in series to each other via wires. The light emitting cells may have an active region including an InGaN layer to emit blue light. The blue light emitting diode chip 30a is mounted on the landing pad 23 located at the center of the first cavity 21a.

The red light emitting diode chips 30b are mounted on the landing pads 23 disposed around the landing pad located at the center of the first cavity 21a, respectively. Accordingly, the red light emitting diode chips 30b are disposed around the blue light emitting diode chip 30a. The red light emitting diode chips 30b may have an active region formed of an AlGaInP or AlGaAs-based compound semiconductor to emit red light.

The blue and red light emitting diode chips 30a, 30b are connected in series to one another between the bonding pads 25a, 25b via the wires. Here, the serial connection means that the light emitting diode chips 30a, 30b are connected to one another to allow a forward current to flow upon application of voltage to the opposite ends of the light emitting diode chips. In other words, the light emitting diode chips 30a, 30b and the bonding pads 25, 25a, 25b are connected to one another such that the light emitting diode chips 30a, 30b are operated upon application of a forward voltage to the bonding pads 25a, 25b.

Further, Zener diodes 30c may be mounted to protect the light emitting diode chips 30a, 30b. The Zener diodes 30c are connected in parallel to the light emitting diode chips 30a, 30b to protect the light emitting diode chips from electrostatic discharge. As shown in FIG. 3, two Zener diodes 30c are connected with opposite polarities in parallel to the light emitting diode chips. Here, the Zener diodes 30 may be mounted on the bonding pads 25a, 25b. Since the Zener diodes 30c have a vertical structure wherein pads having wires bonded thereto are located on different planes, one pad is connected to the bonding pad. Thus, it is possible to provide the Zener diodes connected with the opposite polarities by connecting pads located at an upper side to each other via the wires.

The molding portion 31 covers the light emitting diode chips 30a, 30b within the first cavity 21a. The molding portion 31 may be formed of a transparent material, for example, epoxy or silicone. During an operation under a high voltage, a large amount of heat may be generated from the light emitting diode chips 30a, 30b and impose thermal stress on the molding portion 31. Thus, the molding portion 31 may be formed of, for example, gel-type silicone to endure the thermal stress.

The phosphor may be distributed in the molding portion 31. The phosphor converts a frequency of some light emitted from the blue light emitting diode chip 30a. For example, the phosphor may be green or yellow phosphor. Further, the phosphor scatters light emitted from the blue and red light emitting diode chips 30a, 30b to mix the light. Further, a diffusing agent may be distributed in the molding portion 31 for mixing the light.

The lens 35 is bonded onto the molding portion 31 by the lens agent 33. The lens agent 33 is preferably a high hardness silicone in order to enhance interface characteristics between the molding portion 31 and the lens 35. For example, the high hardness silicone may have a Durometer shore hardness of 60 or more. On the other hand, hardness of a silicone does not exceed a Durometer shore hardness of 100.

Although a plastic lens may also be used as the lens 35, a glass lens is preferably used as the lens 35 to prevent moisture infiltration. The lens 35 is bonded onto the second cavity 21b and a side surface of the lens 35 is also provided with the bonding agent 33 to prevent moisture infiltration. The bonding agent 33 fills a space between an inner wall of the second cavity 21b and the lens 35, and some of the bonding agent 33 is provided to an upper portion of the lens 35 along a rounded upper surface of the lens. Accordingly, it is possible to prevent moisture infiltration through a gap between the inner wall of the second cavity 21b and the lens 35 and to steadily secure the lens 35 to the package body 21.

In this embodiment, the red light emitting diode chips 30b exhibit a 2-bonding die structure wherein pads with wires bonded thereto are located on the same side, but may have a 1-bonding die structure wherein the pads with the wires bonded thereto are located on different sides, respectively. In this case, the bonding pads 25 may be omitted and the wires may connect the landing pads to the red light emitting diode chips 30b.

In this embodiment, the phosphor is illustrated as being distributed in the molding portion 31, but the present invention is not limited thereto. For example, the phosphor may be located above the molding portion 31.

In this embodiment, the blue and red light emitting diode chips 30a, 30b are provided for illustration, but the present invention is not limited thereto. That is, any combination of light emitting diode chips emitting light of different frequencies may be used to realize a specific color. Further, a single light emitting diode chip having a plurality of light emitting cells connected in series to one another may be used.

FIG. 3 is an equivalent circuit diagram of the light emitting diode package of FIG. 1.

Referring to FIG. 3, the blue and red light emitting diode chips 30a, 30b are connected in series to one another between the lead electrodes 29a, 29b. The blue light emitting diode chip 30a includes a plurality of light emitting cells 30d connected in series to one another. For example, 12 light emitting cells 30d may be connected in series to one another on a single substrate, and three red light emitting chips 30b are connected to either side of the blue light emitting diode chip 30a. Here, it should be understood that the number of light emitting cells and the number of red light emitting diode chips are not limited to specific numbers, and that a blue light emitting diode chip having more light emitting cells and red light emitting diode chips may be mounted in the package. Here, in order to realize warm white light, the ratio of the number of light emitting cells to the number of red light emitting diode chips may be about 2:1 in consideration of optical efficiency of the current light emitting diode chips and conversion efficiency of the phosphor.

Further, although the blue light emitting diode chip 30a is illustrated as being connected between the blue light emitting diode chips 30b, the positions of these chips 30a, 30b are not specifically limited so long as they are connected in series.

Meanwhile, the Zener diodes 30c are connected in parallel to the light emitting diode chips 30a, 30b. Here, the Zener diodes 30c are connected with opposite polarities. Thus, even in the case where a high voltage is temporarily forwardly or reversely applied to the light emitting diode chips 30a, 30b, it is possible to protect the light emitting diode package from electrostatic discharge by the Zener diodes 30c.

The opposite terminals of the light emitting diode chips connected in series to one another, that is, the lead electrodes 29a, 29b, may be electrically connected to a bridge rectifier (not shown), so that the light emitting diode package may be operated under a high AC voltage.

Figure 4:
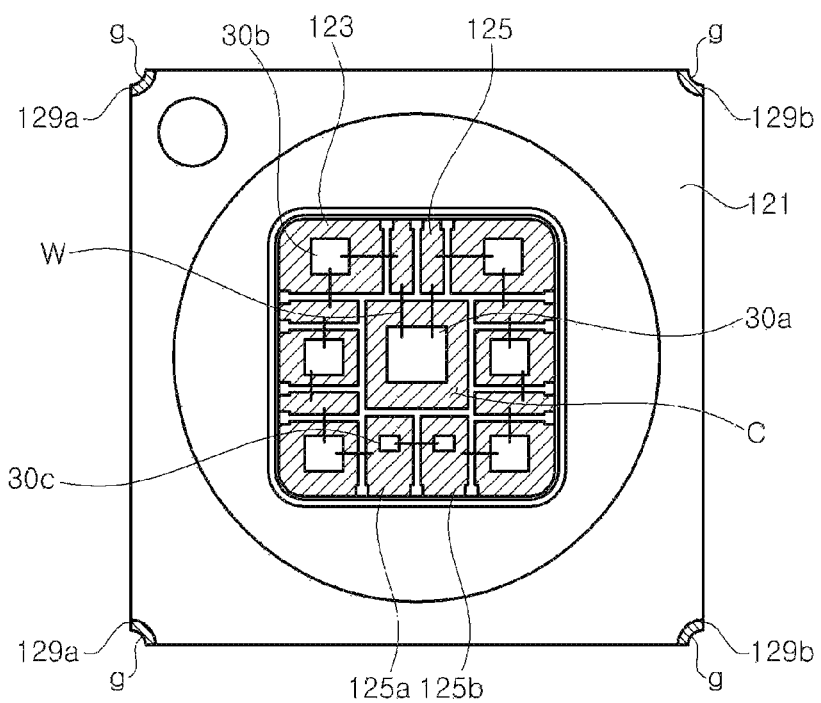
FIG. 4 is a plan view of a high voltage light emitting diode package in accordance with a second embodiment of the present invention.
Figure 5:
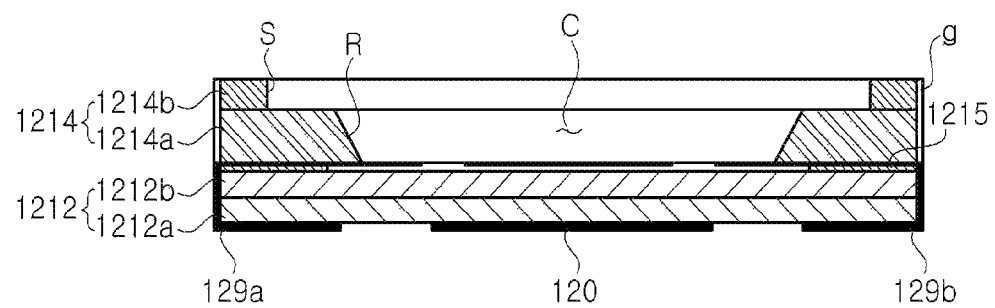
FIG. 5 is a cross-sectional view of the high voltage light emitting diode package shown in FIG. 4.
Figure 6:
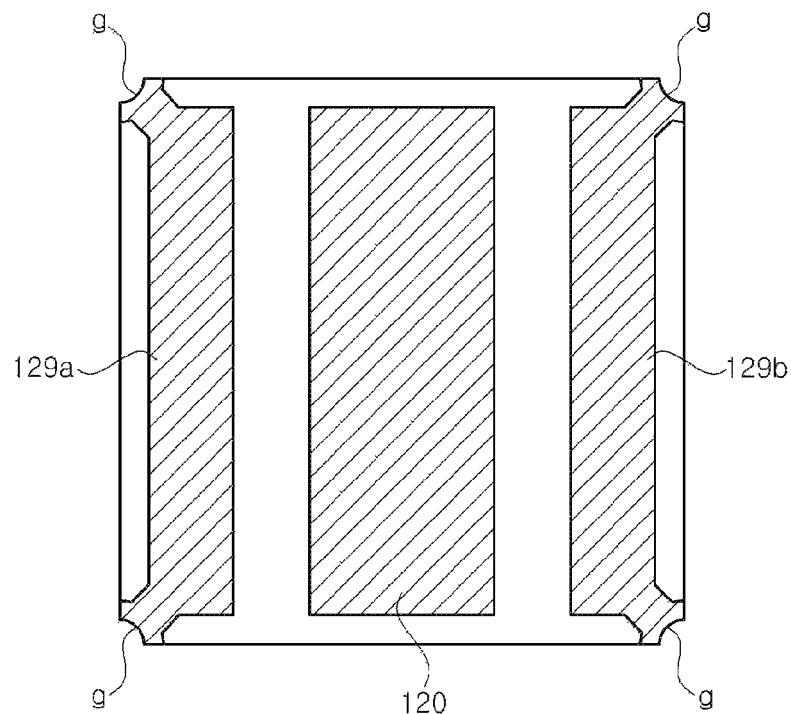
FIG. 6 is a detailed bottom plan view of the high voltage light emitting diode package shown in FIG. 4.

FIG. 4 is a plan view of a high voltage light emitting diode package in accordance with a second embodiment, FIG. 5 is a cross-sectional view of the high voltage light emitting diode package shown in FIG. 4, and FIG. 6 is a detailed bottom plan view of the high voltage light emitting diode package shown in FIG. 4.

Referring to FIG. 4, the light emitting diode package of this embodiment includes a package body 121, a plurality of landing pads 123, a blue light emitting diode chip 30a, a plurality of red light emitting diode chips 30b, a phosphor (not shown), and a pair of lead electrodes 129a, 129b. The light emitting diode package may further include bonding pads 125, 125a, 125b and wires W. Although not shown in the drawings, the light emitting diode package of this embodiment may further include a molding portion 31, a bonding agent 33 and a lens 35, as in the above embodiment.

In this embodiment, the package body 121 has a ceramic stack structure. The ceramic stack structure of the package body 121 is best shown in FIG. 5.

Referring to FIG. 5, the package body 121 includes a package lower part 1212 and a package upper part 1214, and a middle layer 1215 is interposed between the package upper and lower parts 1212, 1214. The middle layer 1215 has conductive patterns and dielectric materials. The package lower part 1212 has a double-layer structure of a first ceramic substrate 1212a and a second ceramic substrate 1212b. Alternatively, the package lower part 1212 may be composed of a single dielectric substrate or may have a multi-layer structure having three or more dielectric substrates stacked on one another. The package upper part 1214 includes a third ceramic substrate 1214a and a fourth ceramic substrate 1214b stacked on the third ceramic substrate 1214a. The third ceramic substrate 1214a includes a cavity at the center thereof and serves as a cavity wall for accommodating the light emitting diode chips within the cavity. An inner surface R of the cavity wall is slanted and has a reflective portion, in particular, a metal reflection layer, formed thereon.

The fourth ceramic substrate 1214b has a smaller cavity than the third ceramic substrate 1214a, so that a step S is formed between the third ceramic substrate 1214a and the fourth ceramic substrate 1214b due to a size difference between the cavities, and a lens (not shown) may be reliably fitted into the step S.

The conductive patterns of the middle layer 1215 include the landing pads 123 and the bonding pads 125, 125a, 125b, as shown in FIG. 4. Each of the lead electrodes 129a, 129b extends to a lower surface of the package lower part 1214, that is, a lower surface of the package body 121, to have a wide area along a side periphery of the package lower part 1214, in particular, side corners of the package lower part 1214, while being connected to the corresponding conductive pattern on the package lower part 1214.

Referring to FIG. 6, the pair of lead electrodes 129a, 129b may be separated from each other, and may be formed to have a wide area on the lower surface of the package body and to be joined to, for example, conductive landing patterns (not shown) on a printed circuit board (PCB, not shown) by soldering. In this embodiment, the pair of lead electrodes 129a, 129b are located at right and left sides on the lower surface of the package body, and a heat dissipation portion 120 is formed in a metal pattern between the lead electrodes 129a, 129b, that is, on a central area of the lower surface of the package body. The heat dissipation portion 120 is separated from the pair of lead electrodes 129a, 129b on the lower surface of the package body 121.

Referring to FIGS. 4 to 6, the package body 121 is formed at four corners thereof with corner grooves "g", which are vertically elongated, such that the pair of lead electrodes 129a, 129b extends from the upper surface of the package lower part 1212 to the lower surface of the package upper part 1212 through the corner grooves "g". The lead electrodes 129a, 129b are exposed to side surfaces of the package body 121 in the corner grooves "g", thereby contributing to enhanced heat dissipation of the light emitting diode package. Further, the lead electrodes 129a, 129b extend to surround the package lower part 1212 comprising ceramic substrates 1212a, 1212b from the upper surface of the package lower part 1212 to the lower surface of the package upper part 1212, thereby further reliably securing the ceramic substrates 1212a, 1212b, which constitute the package lower part.

In the package body 121, the bottom surface of the cavity may be located on an interface between the package lower part 1212 and the package upper part 1214, where the middle layer 1215 is present. As described above, the middle layer 1215 includes the conductive patterns, which include the landing pads 123 and the bonding pads 125, 125a, 25b, so that the landing pads 123 and the bonding pads 125, 125a, 25b are located on the bottom surface of the cavity in the package body 121.

As best shown in FIG. 4, one landing pad 123 may be positioned at the central region on the bottom surface of the cavity C and other landing pads 123 may be disposed around the landing pad 123. These landing pads 123 are separated from one another on the bottom surface of the cavity C. The landing pads 123 may be formed of a metallic material having high reflectivity, such as Ag, Al or Cu.

As in the first embodiment, the bonding pads 125, 125a, 125b may be disposed on the bottom surface of the cavity C. The bonding pads 125, 125a, 125b are separated from the landing pads 123 and located between the landing pads 123. The bonding pads 125, 125a, 125b may be formed of the same material as that of the landing pads 123, but are not limited thereto. The bonding pads 125, 125a, 125b may be formed of a different conductive material from that of the landing pads 123. Two bonding pads 125a, 125b are electrically connected to the lead electrodes 129a, 129b exposed to the side surface and lower surface of the package body 121.

As in the first embodiment, the lead electrodes 129a, 129b are positioned on the lower surface of the package body 121 to receive power from an external power source. Further, the lead electrodes 129a, 129b may be connected to a bridge rectifier.

Here, as in the first embodiment, the blue light emitting diode chip 30a may include a plurality of light emitting cells 30d (see FIG. 3) connected in series to one another on a single substrate. Pads for wire bonding are provided to opposite sides of the light emitting cells serially connected to one another. In such a blue light emitting diode chip 30a, the light emitting cells are formed of an AlInGaN-based compound semiconductor and are connected in series to one another via wires. The light emitting cells may have an active region including an InGaN layer to emit blue light. As shown in FIG. 4, the blue light emitting diode chip 30a is mounted on the landing pad 125 located at the center of the cavity.

Meanwhile, a plurality of red light emitting diode chips 30b are mounted on the landing pads 125 disposed around the landing pad located at the center of the cavity, respectively. Accordingly, the red light emitting diode chips 30b are disposed around the blue light emitting diode chip 30a. The red light emitting diode chips 30b may have an active region formed of an AlGaInP or AlGaAs-based compound semiconductor to emit red light.

The blue and red light emitting diode chips 30a, 30b are connected in series to one another between the bonding pads 125a, 125b via the wires. Here, the series connection means that the light emitting diode chips 30a, 30b are connected to one another to allow a forward current to flow upon application of a voltage to the opposite ends of the light emitting diode chips. In other words, the light emitting diode chips 30a, 30b and the bonding pads 125, 125a, 125b are connected to one another such that the light emitting diode chips 30a, 30b are operated upon application of a forward voltage to the bonding pads 125a, 125b (see FIG. 3).

Further, Zener diodes 30c may be mounted to protect the light emitting diode chips 30a, 30b. The Zener diodes 30c are connected in parallel to the light emitting diode chips 30a, 30b to protect the light emitting diode chips from electrostatic discharge. As in the above embodiment, two Zener diodes 30c are connected with opposite polarities in parallel to the light emitting diode chips (see FIG. 3). Here, the Zener diodes 30 may be mounted on the bonding pads 125a, 125b. Since the Zener diodes 30c have a vertical structure wherein pads having wires bonded thereto are located on different planes, a single pad is connected to the bonding pad. Thus, it is possible to provide the Zener diodes connected with the opposite polarities by connecting pads located at an upper side to each other via the wires.

Figure 7:
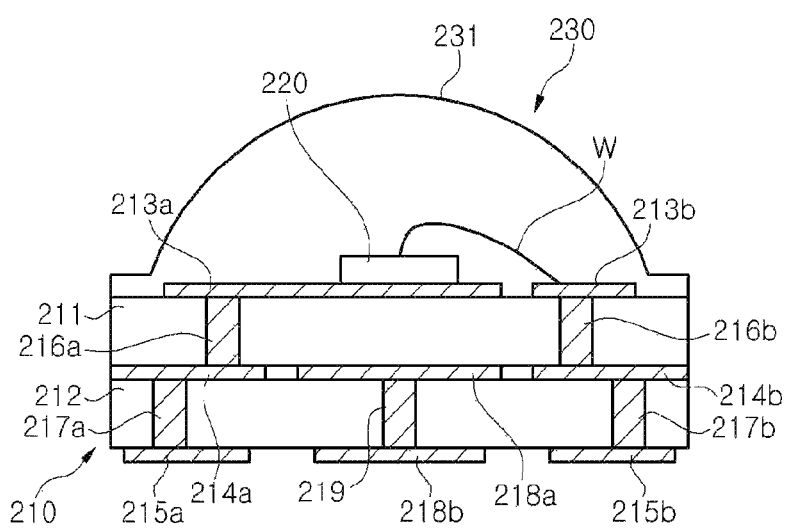
FIG. 7 is a cross-sectional view of a light emitting diode package in accordance with a third embodiment of the present invention.
Figure 8:
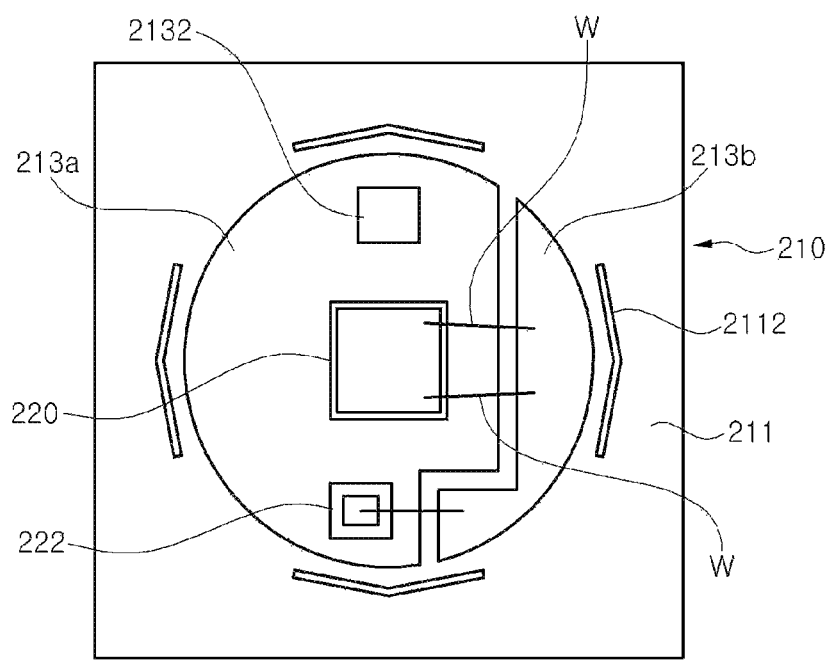
FIG. 8 is a plan view of the light emitting diode package in accordance with the third embodiment, from which an encapsulating portion is removed.

FIG. 7 is a cross-sectional view of a light emitting diode package in accordance with a third embodiment, FIG. 8 is a plan view of the light emitting diode package in accordance with the third embodiment, from which an encapsulating portion is removed, and FIGS. 9(a) and (b) show metal patterns and lead electrodes of the light emitting diode package in accordance with the third embodiment.

Referring to FIG. 7, the light emitting diode package of this embodiment includes a package body 210 serving as a heat dissipation substrate, and a light emitting diode chip 220 mounted on the package body 210. The light emitting diode package includes a transparent encapsulating portion 231 which covers an entire upper surface of the package body 210. The transparent encapsulating portion 231 may be formed by molding a silicone resin. Alternatively, the transparent encapsulating portion 231 may be formed of other kinds of transparent resin, such as an epoxy resin and the like. The transparent encapsulating portion 231 may have a convex lens shape, the center of which is coincident with that of the light emitting diode chip 220.

The package body 210 includes an upper substrate 211 (hereinafter, "upper dielectric substrate") formed of a dielectric ceramic material and a lower substrate 212 (hereinafter, "lower dielectric substrate") formed of a dielectric ceramic material. The upper and lower dielectric substrates 211, 212 are stacked on each other in the vertical direction. A bonding material may be used to stack the dielectric substrates. The upper dielectric substrate 211 is formed at an upper surface thereof with a first upper conductive pattern 213a acting as a landing pad and a second upper conductive pattern 213b acting as a bonding pad. The first and second upper conductive patterns 213a, 213b may be formed on the upper surface of the upper dielectric substrate 211 by plating metal such as Au or Ag.

In this embodiment, the light emitting diode chip 220 includes a vertical structure which includes electrodes at upper and lower ends thereof. The light emitting diode chip 220 is die-attached to the first upper conductive pattern 213a such that the lower end electrode of the light emitting diode chip 220 is connected to the first upper conductive pattern 213a. The upper end electrode of the light emitting diode chip 220 is electrically connected to the second upper conductive pattern 213b by a bonding wire W. The light emitting diode chip 220 may be a lateral type that includes both a p-type electrode and an n-type electrode at an upper side thereof. In this case, a plurality of bonding wires is required to connect the p-type electrode and n-type electrode of the light emitting diode chip 220 to the upper conductive patterns, respectively.

Referring to FIG. 8, the upper conductive patterns 213a, 213b are formed to define a circular region together on the upper surface of the upper dielectric substrate 211. Further, discrimination marks 2112 are formed around the circular region to confirm or discriminate the position where a lens 231 of the encapsulating portion (see FIG. 13) is formed. The discrimination marks 2112 may be formed by printing a black silk on the upper dielectric substrate 211.

Further, an alignment mark 2132 is formed on the first upper conductive pattern 213a in order to achieve accurate alignment of light emitting diode chips or accurate detection of an alignment error of the light emitting diode chips in a process of fabricating a light emitting diode package. The alignment mark 2132 is formed by intentionally avoiding plating on a partial region in the upper conductive pattern 213a and exposing an unplated region of the dielectric substrate to the outside. For example, when plating is performed with a mask covering a region on which the alignment mark 2132 will be formed, the unplated region forms the alignment mark 2132. In this embodiment, the Zener diodes 222 are mounted on the first upper conductive pattern 213a and are connected to the second upper conductive pattern 213b by bonding wires W. Although two bonding wires W, W are shown as connecting two electrodes of the light emitting diode chip 220 to the second upper conductive pattern 213b, it should be understood that the number of bonding wires does not limit the scope of the invention.

Referring again to FIG. 7, the lower dielectric substrate 212 has first and second lower conductive patterns 215a, 215b formed on a lower surface thereof to act as terminals of the lead electrodes. Preferably, the lower conductive patterns 215a, 215b may be formed by Ag plating. It should be understood, however, that the lower conductive patterns 215a, 215b may be formed of any other metal. Further, first and second middle conductive patterns 214a, 214b are formed between the upper and lower dielectric substrates 211, 212. The first and second middle conductive patterns 214a, 214b may be formed by Au or Ag plating.

The first upper conductive pattern 213a and the first middle conductive pattern 214a are connected to each other through a first upper via 216a which perpendicularly penetrates the upper dielectric substrate 211, and the first middle conductive pattern 214a and the first lower conductive pattern 215a are connected to each other through a first lower via 217a which perpendicularly penetrates the lower dielectric substrate 212. Further, the second upper conductive pattern 213b and the second middle conductive pattern 214b are connected to each other through a second upper via 216b which perpendicularly penetrates the upper dielectric substrate 211, and the second middle conductive pattern 214b and the second lower conductive pattern 215b are connected to each other through a second lower via 217b which perpendicularly penetrates the lower dielectric substrate 212. The first and second upper vias 216a, 216b and the first and second lower vias 217a, 217b may be formed of tungsten, which exhibit good thermal and electrical conductivity and has high melting point, but may be formed of any other metallic material. Comparing the terms used in this embodiment with those in the first and second embodiments, the first and second upper conductive patterns 214a and 214b may correspond to the landing pad and the bonding pad, respectively. Further, the upper vias 216a, 216b, middle conductive patterns 214a, 214b, lower vias 217a, 217b, and first and second lower conductive patterns 215a, 215b may correspond to the lead electrodes of the first and second embodiments.

In the second embodiment, the lead electrodes extend to the lower surface of the package body along the side periphery of the package body, whereas the lead electrodes of this embodiment extend to the lower surface of the package body through the package body.

On the other hand, the light emitting diode package may be mounted on a PCB (not shown), in which the first and second lower conductive patterns 215a, 215b may be connected to electrode pads (not shown) on the PCB by soldering.

The first and second middle conductive patterns 214a, 214b extend to side surfaces of the upper and lower dielectric substrates 211, 212, that is, the outermost periphery of the package body 221 to be exposed to the outside of the package body thereon. The thermal conductivity of the conductive patterns and the vias is superior to that of the dielectric substrates. Thus, as the first and second middle conductive patterns 214a, 214b are exposed to outer air on the side surface of the package body 221, so that heat dissipation of the package body 221 is further enhanced by convection.

In this embodiment, the package body 221 is one of several heat dissipation substrates formed by dicing a single large substrate, which includes stacked dielectric substrates, conductive patterns, vias, and the like to form a plurality of packages. More specifically, the light emitting diode package or the package body 221 includes a cut plane formed by dicing, on which a side surface of the upper dielectric substrate 211 and a side surface of the lower dielectric substrate 212 are included. The first and second middle conductive patterns 214a, 214b extend to the cut plane to be exposed to the outside on the cut plane. On the contrary, all of the upper conductive patterns 213a, 213b and all of the lower conductive patterns 215a, 215b are formed in limited areas so as not to reach the cut plane, that is, the side surfaces of the upper and lower dielectric substrates 211, 212.

Referring to FIG. 9(a), it can be seen that each of the first and second middle conductive patterns 214a, 214b has three sides coincident with outer side surfaces of the lower dielectric substrate 212 on the upper surface of the lower dielectric substrate 212, that is, between the upper and lower dielectric substrates. Further, referring to FIG. 9(b), it can be seen that the first and second lower conductive patterns 215a, 215b do not have a side coincident with the side surface of the lower dielectric substrate 212 and are formed in limited areas inside the lower dielectric substrates 212. Referring to FIG. 8, it can be seen that the first and second conductive patterns 213a, 213b are also formed in limited areas inside the lower dielectric substrates 212.

Referring again to FIG. 7, the first upper and lower vias 216a, 217a are connected to the first middle conductive pattern 214a while alternating with each other. Further, the second upper and lower vias 216b, 217b are connected to the second middle conductive pattern 214b while alternating with each other. By placing the upper and lower vias 216a, 216b connected to each other via one middle conductive pattern 214a or 214b to alternate with each other, it is possible to increase the number of heat dissipation paths while enlarging the area of the heat dissipation paths within the upper and lower dielectric substrates 211, 212. Further, the alternate arrangement of the upper via 216a or 216b and the lower via 217a or 217b increases the total length of a heat path extending from the upper via 216a or 216b to the lower via 217a or 217b through the middle conductive pattern 214a or 214b as compared with linear arrangement of the upper and lower vias, so that heat may be more uniformly distributed into the package body 221 and more efficiently discharged outside.

Figure 9:
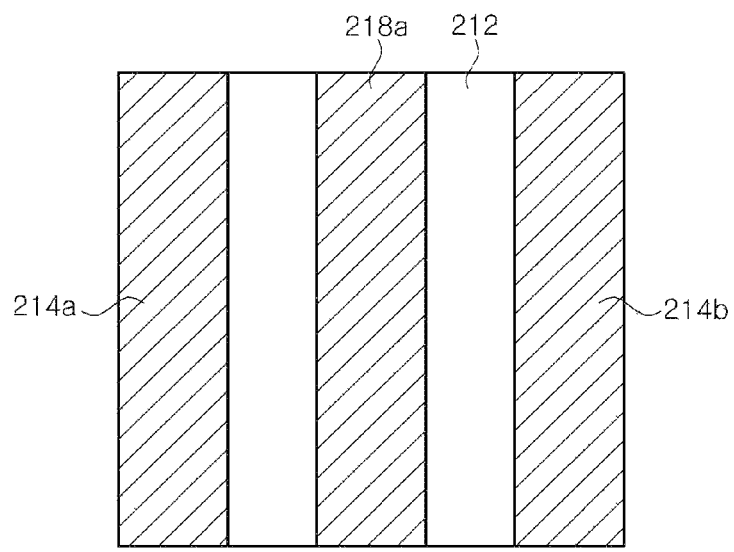
FIG. 9(a) is a plan view of a lower dielectric substrate of the light emitting diode package shown in FIG. 7, which has middle conductive patterns and lower conductive patterns formed thereon.
FIG. 9(b) is a bottom view of the lower dielectric substrate of the light emitting diode package shown in FIG. 7, which has the middle conductive patterns and lower conductive patterns formed thereon.
Figure 9:
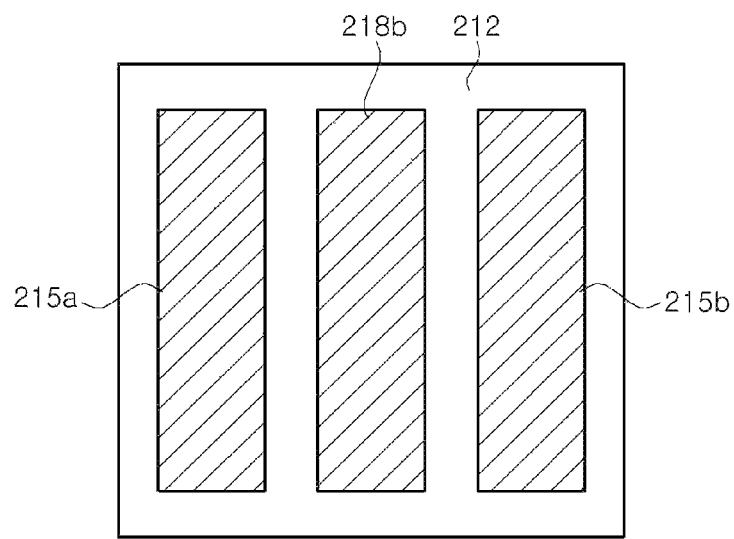

Referring to FIG. 7 and FIGS. 9 (a) and (b), the light emitting diode package according to this embodiment further includes first and second heat sink patterns 218a, 218b acting as a heat dissipation part, and a heat transfer via 219. The first heat sink pattern 218a is interposed between the upper and lower dielectric substrates 211, 212 and the second heat sink pattern 218b is formed on the lower surface of the lower dielectric substrate 212.

The first heat sink pattern 218a is disposed between the first middle conductive pattern 214a and the second middle conductive pattern 214b on the upper surface of the lower dielectric substrate 212, and may be formed by the same plating process using the same metallic material as those of the first and second middle conductive patterns 214a, 214b. Further, the second heat sink pattern 218b is disposed between the first lower conductive pattern 215a and the second lower conductive pattern 215b on the lower surface of the lower dielectric substrate 212, and may be formed by the same plating process using the same metallic material as those of the first and second lower conductive patterns 215a, 215b.

The first and second heat sink patterns 218a, 218b and the heat transfer via 219 are added to enhance heat dissipation near the center of the package body 221 and compensate for the heat dissipation mainly obtained at the periphery of the package body by the middle conductive patterns, lower vias, and lower conductive patterns described above.

According to the aforementioned third embodiment, a single first upper conductive pattern 213a acting as the landing pad and a single second upper conductive pattern acting as the bonding pad 213b are present on the package body 221. According to another embodiment, however, a light emitting diode package may include a plurality of light emitting diode chips mounted on a plurality of landing pads and serially connected to one another thereon, in which the plurality of landing pads are provided to a package body including upper and lower dielectric substrates with middle conductive patterns, vias, and lower conductive patterns formed thereon, as in the first and second embodiments. Here, it should be understood that the light emitting diode package may include a plurality of bonding pads.

Hereinafter, other embodiments of the package body applicable to the present invention will be described. A detailed description of repetitious elements described above will be omitted herein. Like elements will be denoted by like reference numerals.

Figure 10:
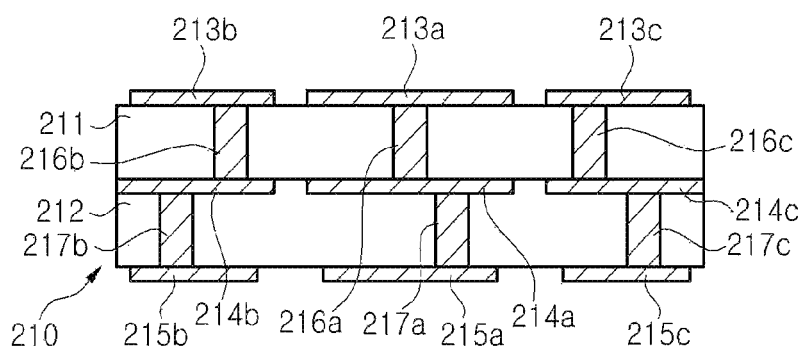
FIG. 10 is a cross-sectional view of a package body in accordance with another embodiment of the present invention.
Figure 11A:
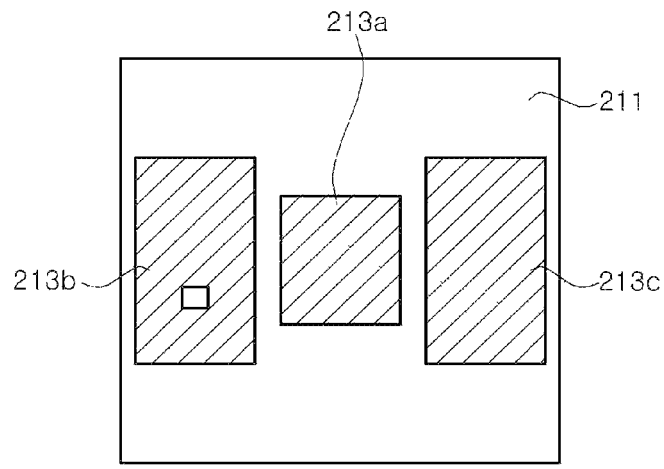
FIGS. 11(a), (b) and (c) are views of respective layers of the package body.

FIG. 10 is a cross-sectional view of a package body in accordance with another embodiment, and FIGS. 11(a), (b) and (c) show layers of the package body.

As shown in FIG. 10, a package body 221 of this embodiment includes an upper dielectric substrate 211 and a lower dielectric substrate 212 as in the package body of the above embodiments. In this embodiment, however, the heat sink patterns and the heat transfer via-vias are omitted, and different numbers and arrangement of conductive patterns and upper or lower vias capable of acting as a heat sink are provided. This will be described in more detail hereinafter.

Referring to FIG. 10 and FIG. 11(a), the upper dielectric substrate 211 includes a first upper conductive pattern 213a formed at the center thereof and second and third upper conductive patterns 213b, 213c formed at opposite sides thereof. A vertical type light emitting diode chip or lateral-type light emitting diode chip may be provided on the upper conductive pattern 213a by die-attaching. When the lateral-type light emitting diode chip is provided on the upper conductive pattern 213a by die-attaching, the first upper conductive pattern 213a is not electrically connected to the light emitting diode chip and thus will act only as a heat sink along with a first middle conductive pattern 214a, first lower conductive pattern 215a, first upper via 216a and first lower via 217a described below. On the other hand, when the vertical-type light emitting diode chip is provided on the upper conductive pattern 213a by die-attaching, a lower electrode of the vertical light emitting diode chip is electrically connected to the first upper conductive pattern 213a. Thus, the first upper conductive pattern 213a will act as both a path for supplying power to the light emitting diode chip and a heat sink. Although not shown in the drawings, the first and/or second upper conductive pattern(s) 213b and/or 213c are electrically connected to an electrode(s) of the light emitting diode chip via a bonding wire(s). The first, second, and third upper conductive patterns 213a, 213b, 213c do not reach a side surface of the upper dielectric substrate 211 and are formed in limited areas inside the upper dielectric substrate 211. This configuration is provided to prevent damage or detachment of the patterns when dicing the substrate, as illustrated in the above embodiment.

Figure 11B:
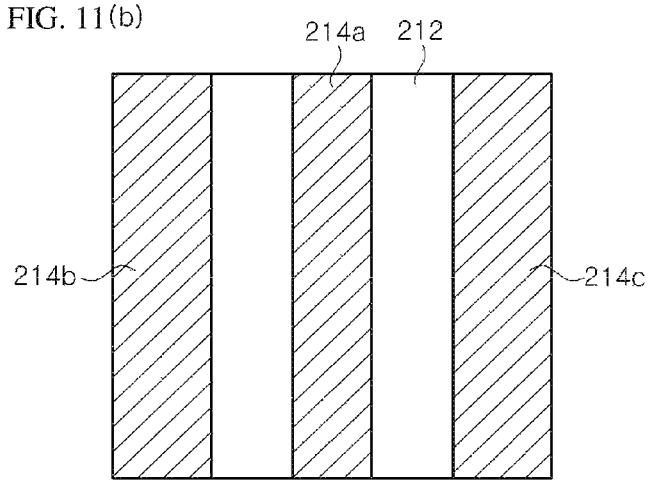

Referring to FIG. 10 and FIG. 11(a), first, second and third middle conductive patterns 214a, 214b, 214c are formed on an upper surface of the lower dielectric substrate 212 or a lower surface of the upper dielectric substrate 211, that is, between the upper and lower dielectric substrates 211, 212. The first middle conductive pattern 214a is connected to the first upper conductive pattern 213a through the first upper via 216a, the second middle conductive pattern 214b is connected to the second upper conductive pattern 213b by the second upper via 216b, and the third middle conductive pattern 214c is connected to the third upper conductive pattern 213c through the third upper via 216c. As best shown in FIG. 11(b), the first middle conductive pattern 214a has two sides coincident with side surfaces of the lower dielectric substrate 212 to be exposed to the outside of the package body thereon, and each of the second and third middle conductive patterns 214b, 214c has three sides coincident with side surfaces of the lower dielectric substrate 212 to be exposed to the outside of the package body thereon.

Figure 11C:
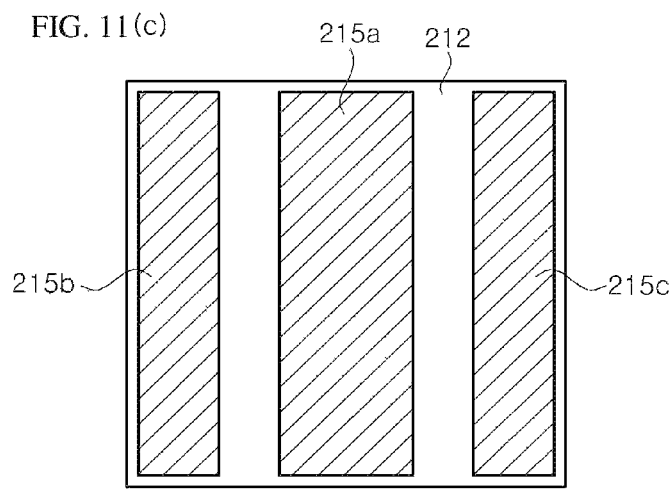

Referring to FIG. 10 and FIG. 11(c), first, second and third lower conductive patterns 215a, 215b, 215c are formed on a lower surface of the lower dielectric substrate 212. The first lower conductive pattern 215a is connected to the first middle conductive pattern 214a through the first lower via 217a, the second lower conductive pattern 215b is connected to the second middle conductive pattern 214b through the second lower via 217b, and the third lower conductive pattern 215c is connected to the third middle conductive pattern 214c through the third lower via 217c. The first, second, and third lower conductive patterns 215a, 215b, 215c do not reach a side of the lower dielectric substrate 212 and are formed in limited areas inside the lower dielectric substrate 212. This configuration is provided to prevent damage or detachment of the patterns when dicing the substrate.

As best shown in FIG. 10, the first upper via 216a and the first lower via 217a are connected to the first middle conductive pattern 214a while alternating with each other, the second upper via 216b and the second lower via 217b are connected to the second middle conductive pattern 214b while alternating with each other, and the third upper via 216c and the third lower via 217c are connected to the third middle conductive pattern 214c while alternating with each other.

Figure 12:
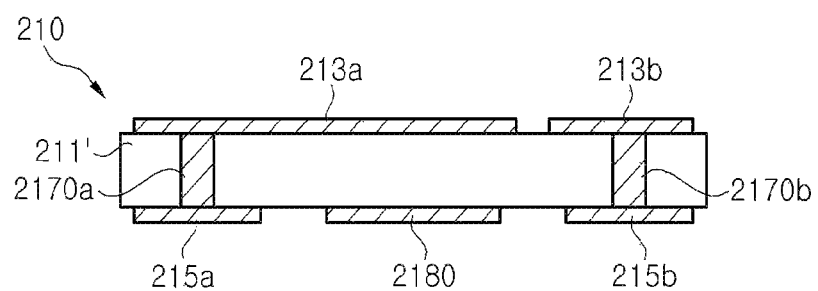
FIG. 12 is a cross-sectional view of a package body in accordance with a further embodiment of the present invention.
Figure 13A:
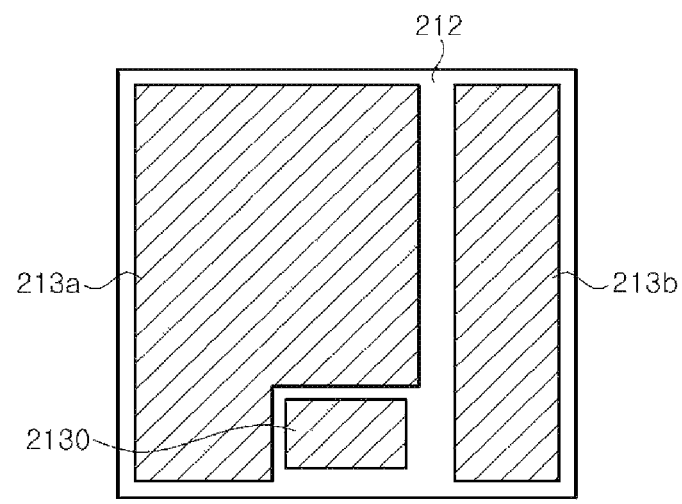
FIGS. 13(a) and (b) are a plan view and a bottom view of the package body shown in FIG. 12.

FIG. 12 is a cross-sectional view of a package body in accordance with a further embodiment of the present invention, and FIGS. 13(a) and (b) are a plan view and a bottom view of the package body shown in FIG. 12.

Referring to FIG. 12 and FIGS. 13(a) and (b), a package body 221 of this embodiment includes a single ceramic dielectric substrate 211'. The ceramic substrate 211' has first and second upper conductive patterns 213a, 213b formed on an upper surface thereof by metal plating, for example, Ag or Au plating. Further, the ceramic substrate 211' has first lower conductive patterns 215a, 215b. The first upper conductive pattern 213a and the first lower conductive pattern 215a are connected to each other through a first via 2170a, and the first upper conductive pattern 213b and the first lower conductive pattern 215b are connected to each other through a second via 2170b. The ceramic substrate 211' is formed at a lower surface thereof with a lower heat sink pattern 2180.

Figure 13B:
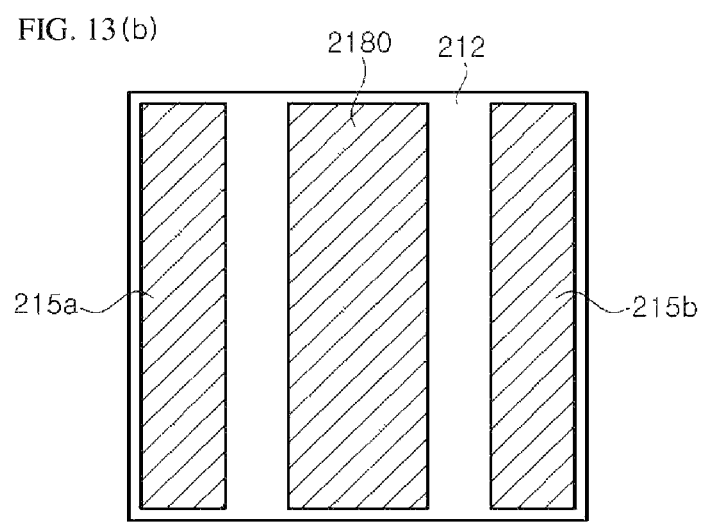

Referring to FIG. 13(b), the ceramic substrate 211' is formed at an upper surface thereof with an upper heat sink pattern 2130. The upper heat sink pattern 2130 may be connected to the lower heat sink pattern 2180 through a heat transfer via (not shown). Here, the upper heat sink pattern 2130 and the heat transfer via connected thereto may also be omitted from the ceramic substrate 211', which has the lower heat sink pattern 2180 formed on the lower surface thereof.

Several embodiments of the present invention are described above in detail. Here, it should be noted that, although a specific element applied to one embodiment is not applied to other embodiments in the present invention, the specific element is not intended to be restrictively applied only to that embodiment, and that element(s) applied to one embodiment may replace element(s) applied to other embodiments or may additionally be applicable to the other embodiments.

What is claimed is:

1. A light emitting diode package, comprising:
a package body and a light emitting diode chip disposed on the package body, the package body comprising:
an upper insulation substrate comprising upper conductive patterns;
a lower insulation substrate comprising lower conductive patterns; and
middle conductive patterns interposed between the upper insulation substrate and the lower insulation substrate,
wherein:
at least one of the middle conductive patterns extends to a side surface of one of the
upper insulation substrate and the lower insulation substrate; and
the at least one middle conductive pattern is exposed to the outside of the package body.

2. The light emitting diode package according to claim 1, wherein: the upper conductive patterns comprise:
a first upper conductive pattern disposed at a center thereof; and
a second upper conductive pattern and a third upper conductive pattern disposed at opposite sides of the first upper conductive pattern, respectively.

3. The light emitting diode package of claim 1, wherein an alignment mark of the light emitting diode chip is disposed on at least one of the upper conductive patterns, the alignment mark being disposed in a region where the upper insulation substrate is at least partially exposed to the upper conductive pattern.

4. The light emitting diode package of claim 1, wherein the upper conductive patterns, the middle conductive patterns, and the lower conductive patterns comprise a metal material.

5. The light emitting diode package of claim 1, wherein:
a side surface of the upper insulation substrate and a side surface of the lower insulation substrate are disposed in a same sectional plane; and
the at least one of the middle conductive pattern extends to the same sectional plane.

6. The light emitting diode package of claim 5, wherein the upper conductive patterns and the lower conductive patterns have edges in different sectional planes.

7. The light emitting diode package of claim 1, further comprising:
upper vias disposed in the upper insulation substrate and electrically connecting the upper conductive patterns to the middle conductive patterns; and
lower vias disposed in the lower insulation substrate and electrically connecting the middle conductive patterns to the lower conductive patterns.

8. The light emitting diode package of claim 7, wherein at least one of the upper vias and at least one of the lower vias are electrically connected to at least one of the middle conductive patterns, and are disposed in different planes.

9. The light emitting diode package of claim 1, wherein two upper conductive patterns are disposed on an upper surface of the upper insulation substrate.

10. The light emitting diode package of claim 9, wherein:
a first heat sink pattern is disposed between the upper insulation substrate and the lower insulation substrate;
a second heat sink pattern is disposed on a lower surface of the lower insulation substrate; and
a heat transfer via connecting the first heat sink pattern to the second heat sink pattern is disposed in the lower insulation substrate.

11. The light emitting diode package of claim 1, further comprising:
a light-transmitting encapsulation material disposed on an upper surface of the upper insulation substrate and covering the light emitting diode chip and the upper conductive patterns.

12. The light emitting diode package of claim 11, wherein the light-transmitting encapsulation material comprises a lens section concentric to the light emitting diode chip.

13. The light emitting diode package of claim 12, wherein an identification mark is disposed on the upper insulation substrate and confirms a location of the lens section.

* * * * *